United States Patent [19]

Demeo

[11] Patent Number: 4,458,969
[45] Date of Patent: Jul. 10, 1984

[54] MEMBRANE SWITCH WITH MEANS FOR PREVENTING SILVER MIGRATION

[75] Inventor: Gregory Demeo, Waltham, Mass.

[73] Assignee: Dorman-Bogdonoff Corporation, Andover, Mass.

[21] Appl. No.: 447,129

[22] Filed: Dec. 6, 1982

[51] Int. Cl.³ .......................................... H01R 13/70
[52] U.S. Cl. .................................. 339/17 F; 29/622; 339/97 C; 339/278 C
[58] Field of Search ......... 29/622; 339/278 R, 278 C, 339/278 M, 176 MF, 97 C, 17 F

[56] References Cited

U.S. PATENT DOCUMENTS 4,243,852  1/1981  Larson ................................ 200/267
4,302,065  11/1981  Taylor ............................... 339/17 F
4,371,225  2/1983  Narozny .......................... 339/97 C Primary Examiner—John McQuade
Assistant Examiner—Paula Austin
Attorney, Agent, or Firm—Wolf, Greenfield & Sacks

[57] ABSTRACT

In a membrane switch having at least one silver conductive lead terminating at a termination point for connection to an electrical connector, the improvement comprising a strip of non-migrating, conductive material applied over said conductive lead at least in a region adjacent to said termination point and extending a distance beyond the termination point of said conductive lead for receipt of said electrical connector affixed to and in electrical contact with said strip of non-migrating, conductive material at the extended portion thereof.

6 Claims, 6 Drawing Figures

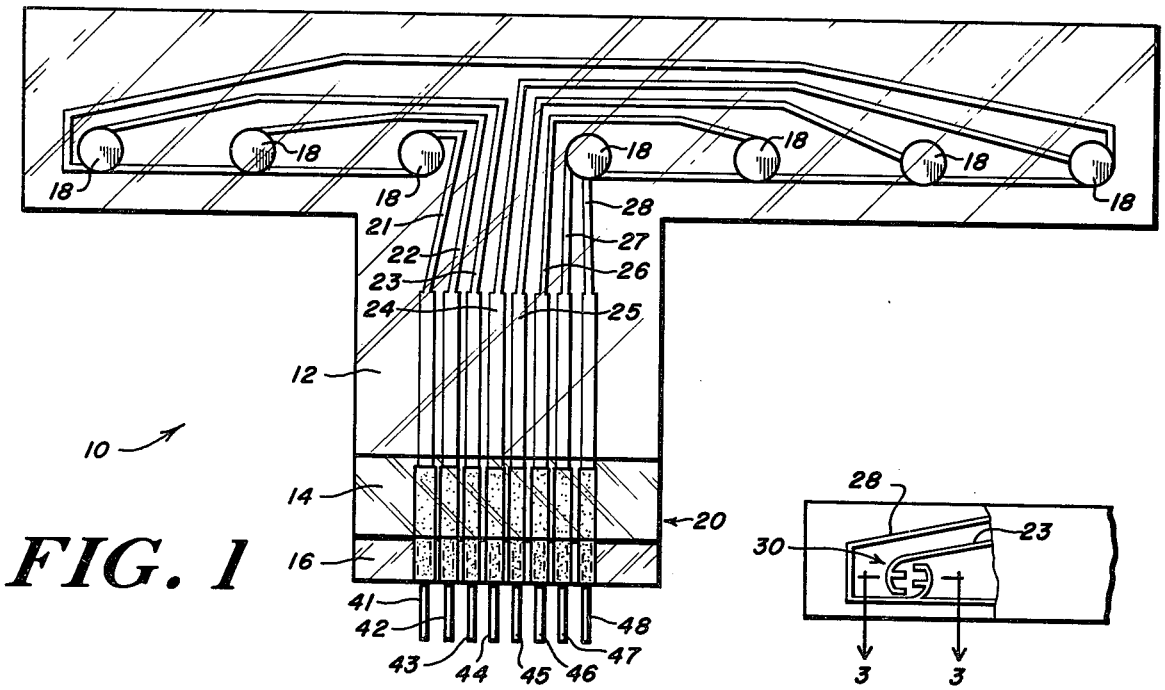
FIG. 1
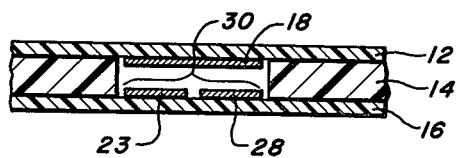
FIG. 2
FIG. 3
FIG. 4
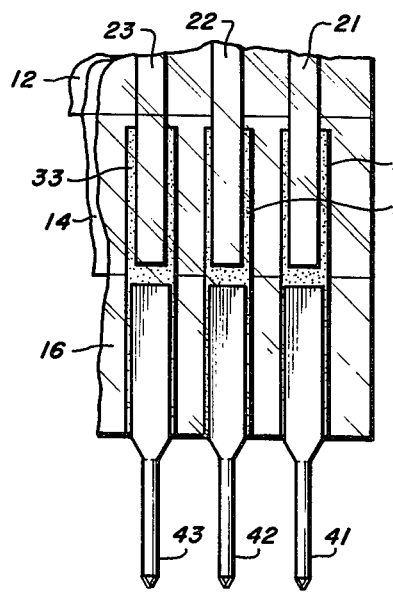
FIG. 5
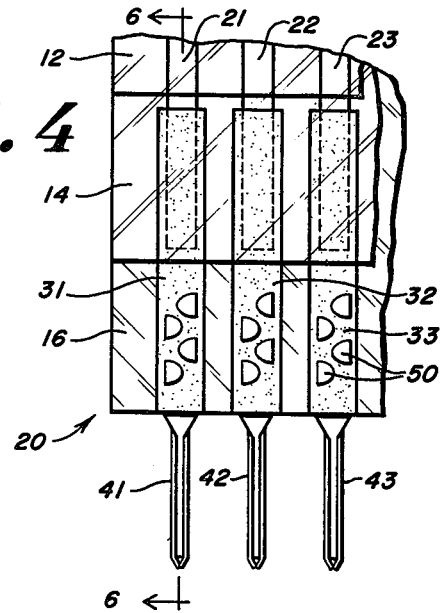
FIG. 6
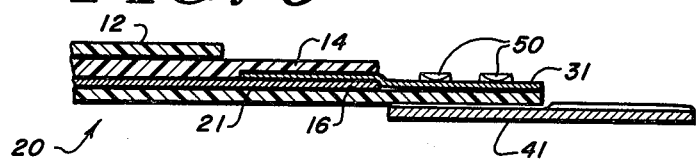

MEMBRANE SWITCH WITH MEANS FOR PREVENTING SILVER MIGRATION

BACKGROUND OF THE INVENTION

This invention relates to membrane switches having silver conductors, and particularly to an improved conductor construction that minimizes silver migration in the region at which electrical connectors are affixed to the switch to enable connection between the conductors and external devices.

A membrane switch typically consists of a bottom layer and a top layer spaced from, but selectively movable into contact with, said bottom layer. Conductors of silver are painted, printed or silk-screened onto the bottom layer and the facing surface of the top layer, silver being employed because of its high electrical conductivity. However, the use of silver presents a serious drawback due to a phenomenon known as silver migration—i.e., the tendency of the silver particles, in a high humidity atmosphere, to migrate from the anode to the cathode, ultimately forming a high impedance short between the separate conductors. A more detailed description of the problem of silver migration is set forth in Larson U.S. Pat. No. 4,243,852. In order to inhibit silver migration, the silver conductors of a membrane switch are often over-coated with a layer of non-migrating, conductive material, such as graphite, in the regions most susceptible to silver migration.

A typical membrane switch includes a tail portion integral with and extending outwardly from the edge of one or both of the conductor-carrying layers, on which tail or tails the individual conductor leads are carried for connection to external circuitry. In order to make the connection to external circuitry, it is the usual practice to attach an electrical connector to each of the conductive leads at or near the outward end of the tail. However, the normal piercing or crimping operation by which a connector is attached to a conductive lead on the tail results in a break in the bond between the silver conductor and the protective over-coating, such that, in the region of the break, the exposed silver is subject to silver migration.

Therefore it is an object of this invention to provide an improved membrane switch in which silver migration at the area of the electrical connectors, normally attached to the conductive leads at or near the end of a tail extending from the switch, is minimized. Other purposes will be evident from the specification, drawings and claims.

BRIEF DESCRIPTION OF THE DRAWINGS

FIG. 1 is a top view of a typical membrane switch formed of transparent plastic layers, and having a flexible tail carrying the conductive leads for connection to external circuitry by means of electrical connectors attached to the leads in accordance with the instant invention.

FIG. 2 is a top view of one of the contact areas 30 of the bottom layer of the switch of FIG. 1, showing the interdigitation of the conductive leads to form the contact area.

FIG. 3 is an enlarged cross-sectional view taken along line 3—3 of FIG. 2.

FIG. 4 is an enlarged top view of a portion of the tail of the switch of FIG. 1, having, in accordance with the instant invention, a coating of non-migrating, conductive material over and continuing beyond the end portion of each silver conductive lead, and an electrical connector attached to the coating (conductor) at a region beyond the end of each of the silver conductive leads.

FIG. 5 is a bottom view of the tail portion of FIG. 4.

FIG. 6 is a cross-sectional view of a single conductor termination on the tail portion of FIG. 4, taken along line 6—6 of FIG. 4.

DETAILED DESCRIPTION OF THE DRAWINGS

FIGS. 1, 2 and 3 illustrate a typical flexible membrane switch 10 comprised of a flexible top layer 12 (FIG. 3) on which silver circular contacts 18 have been silk-screened on the underside of said layer. Top layer 12 is positioned above bottom layer 16 and spaced apart therefrom by a spacer layer 14 furnished with apertures corresponding in shape and position to circular contacts 18. On the upper surface of bottom layer 16 of the switch is deposited the remaining circuitry of the switch, including silver conductive leads 21 through 28 and contact areas 30 (FIGS. 2 and 3), each contact area 30 being positioned below and spaced apart from a corresponding circular contact 18. Conductive lead 28 is a common bus connecting all seven contact areas 30. Each of conductive leads 21–27 is interdigitated with common bus 28 at a contact area 30, one of said contact areas being shown in FIG. 2. Silver conductive leads 21–28 can be seen to terminate near the outer end of tail 20 (See FIG. 4).

Layers 12, 14 and 16 are affixed together by an adhesive such as 3M-467 acrylic-type (not shown). The layers are themselves typically made of polyester, such as Dupont 516, of thickness of approximately 5 to 10 mils. Bottom layer 16 may be affixed to a frame or other support by means of adhesive (not shown). A graphic layer is normally adhered to the top of layer 12.

The switch 10 of FIG. 1 operates in typical fashion. Depression of top layer 12 above a circular contact 18 forces that contact through the corresponding aperture in spacer layer 14 and into electrical contact with the underlying contact area 30 on bottom layer 16 (FIG. 3). Thus, for example, depression of the left-most circular contact 18 of FIG. 1 creates an electrical connection between conductive lead 23 and common bus 28 (FIG. 2), circular contact 18 acting as a shorting bar between the interdigitated fingers of conductive leads 23 and common bus 28 to complete the connection at that contact area.

Turning to FIGS. 4 and 5, only the first three conductive leads are illustrated for convenience. Silver conductive leads 21–23 are shown having strips 31–33 of non-migrating, conductive material, such as graphite, deposited upon the end portion of each lead, respectively; in the embodiment here shown, said strips 31–33 each cover approximately the outermost one-quarter inch of the corresponding silver conductive lead, and extend along the tail 20 beyond the end of each conductive lead for approximately a further one-quarter inch. (See FIG. 6). Thus, in the area beyond the termination of the silver conductive leads, the strips themselves serve as the electrical conductive leads. It will be understood that the length of the strips in any given application will depend upon the particular dimensions and construction of the switch and the type of connector to be employed. In some cases it may be desirable to overcoat not merely the end portion of the silver conductive leads, but most of or even all of the length of the silver conductive leads throughout the switch.

As shown in FIG. 6, in this particular embodiment, tail 20 is comprised of an integral extension of bottom layer 16, layers 12 and 14 being extended over a portion of the length of tail 20 to protect the silver conductive leads 21-28 on layer 16. Spacer layer 14 extends along tail 20 approximately to the point where silver conductive leads 21-28 terminate (see FIG. 5). Top layer 12 extends approximately to the point where the strips 31-38 begin (FIG. 5).

In the preferred embodiment here described, silver conductive leads 21-28 and circular contact areas 18 may be applied by a conventional silk-screening process using, for example, duPont silver conductive ink No. 5007. The graphite strips used in the preferred embodiment here described may also be applied by a conventional silk-screening process, using a graphite screening ink such as Product No. 250-4 made by Amicon Corp., 25 Hartwell Street, Lexington, MA 02173.

As can be seen in FIGS. 1, 4 and 6, in the preferred embodiment, electrical connectors 41-48 are attached to graphite strips 31-38, respectively, by piercing each strip with the bendable metal feet or tabs 50 of each connector and then bending feet or tabs 50 down onto the particular graphite strip, thereby effecting good electrical contact between the connectors and the graphite strips. Such electrical connectors may be obtained, for example, from AMP, Inc. of Harrisburg, Pa. (Solder tab No. 88976-2). By attaching the connectors to the graphite strips in a region beyond the termination of the silver conductive leads, the silver migration problem is avoided in the connector area.

It may be seen from the foregoing that the embodiments described herein are by way of illustration and not by way of limitation, and that various changes in and other modifications to the construction, composition, and arrangement of parts are possible in light of the above teachings. Accordingly, it is to be understood that other embodiments of this invention could be utilized without departing from the spirit and scope of the present invention, as set forth in the appended claims.

I claim:

1. In a membrane switch having at least one silver conductive lead terminating at a termination point for connection to an electrical connector, the improvement comprising a strip of a non-migrating, conductive material applied over said lead at least in a region adjacent to said termination point and extending a distance beyond the termination point of said lead for receipt of said electrical connector affixed to and in electrical contact with said strip at the extended portion thereof.

2. The switch of claim 1 wherein said non-migrating, conductive material comprises graphite.

3. The switch of claim 1 wherein said lead is carried on a flexible tail extending from said switch.

4. The switch of claim 3 wherein said non-migrating, conductive material comprises graphite.

5. A method for preventing silver migration in the area in which the silver conductive leads of a membrane switch are attached to electrical connectors, said switch including at least one silver conductive lead terminating at a termination point, comprising:
   applying a strip of non-migrating, conductive material over said silver conductive lead at least in a region adjacent said termination point and extending a distance beyond said termination point; and
   affixing said electrical connector to said strip at the extended portion thereof.

6. The method of claim 5, wherein said non-migrating conductive material comprises graphite.

* * * * *